(12) United States Patent
Agrawal et al.

(10) Patent No.: US 9,391,637 B2
(45) Date of Patent: Jul. 12, 2016

(54) ERROR CORRECTING CODE SCHEME UTILIZING RESERVED SPACE

(75) Inventors: Rajat Agrawal, Beaverton, OR (US); Debaleena Das, Los Gatos, CA (US); Kai Cheng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 13/997,616

(22) PCT Filed: Mar. 30, 2012

(86) PCT No.: PCT/US2012/031691
§ 371 (c)(1),
(2), (4) Date: Jun. 24, 2013

(87) PCT Pub. No.: WO2013/147890
PCT Pub. Date: Oct. 3, 2013

(65) Prior Publication Data
US 2014/0229797 A1    Aug. 14, 2014

(51) Int. Cl.
*H03M 13/00* (2006.01)
*H03M 13/05* (2006.01)
*G06F 11/10* (2006.01)
*G06F 12/08* (2016.01)
*G11C 29/04* (2006.01)

(52) U.S. Cl.
CPC ........... *H03M 13/05* (2013.01); *G06F 11/1064* (2013.01); *G06F 12/0895* (2013.01); *G11C 2029/0411* (2013.01); *Y02B 60/1225* (2013.01)

(58) Field of Classification Search
None
See application file for complete search history.

(56) References Cited

U.S. PATENT DOCUMENTS

| 7,117,421 | B1 * | 10/2006 | Danilak ........................ 714/763 |
| 7,676,730 | B2 | 3/2010 | Haugan et al. |
| 8,010,876 | B2 | 8/2011 | Hsieh et al. |
| 2006/0098484 | A1 * | 5/2006 | Roohparvar ............. 365/185.09 |
| 2008/0235485 | A1 | 9/2008 | Haertel et al. |
| 2011/0231724 | A1 | 9/2011 | Hara |
| 2012/0254700 | A1 * | 10/2012 | McGinnis et al. ............ 714/773 |

OTHER PUBLICATIONS

International Search Report and Written Opinion for PCT/US2012/031691 mailed Nov. 30, 2012, 9 pages.
International Preliminary Report on Patentability for PCT/US2012/031691 mailed Oct. 9, 2014, 6 pages.

* cited by examiner

*Primary Examiner* — Justin R Knapp
(74) *Attorney, Agent, or Firm* — Blakely, Sokoloff, Taylor & Zafman LLP

(57) ABSTRACT

Methods, techniques, systems and apparatuses for utilizing reserved space for error correcting functionality. A cache line ("reserved line") in a plurality of cache lines to store error correcting code (ECC) data is utilized for storing ECC data corresponding to other cache lines within the plurality of cache lines when a memory device has failed.

15 Claims, 3 Drawing Sheets

ERROR CORRECTING CODE SCHEME UTILIZING RESERVED SPACE

TECHNICAL FIELD

Embodiments of the invention relate to memory systems. More particularly, embodiments of the invention relate to

BACKGROUND

Computer systems, particularly servers, utilize memory devices that are known to be less reliable than would be desirable. Various reliability features have been developed to address this known unreliability. Generically, these features may be referred to as reliability, availability and serviceability (RAS) features. Rank sparing and double device data correction (DDDC) are examples of RAS features.

Rank sparing requires that a whole rank of memory be held in reserve to cover for a failed device in the future. This can be wasteful of system resources. DDDC typically requires lock-stepping, which requires high power consumption and reduced bandwidth. Thus, current RAS features are not particularly resource-efficient.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Various techniques for error correction utilizing reserved space can be accomplished by reserving a cache line (e.g., one of every 16 cache lines for a ×4 memory configuration and one of every 8 cache lines for a ×8 memory configuration) with in a memory (e.g., DRAM) page. In one embodiment, the reserved cache line is not visible to the memory system addressing mechanism. In one embodiment, four reserved cache lines are provided for each page of memory; however, other configurations can also be supported.

In one embodiment, the reserved cache line is use to store four extra bytes for each of the remaining (e.g., 15) cache lines that are visible to the memory system addressing mechanism. This allows each cache line to have 12 bytes (e.g., 8 bytes with the data line and 4 bytes in the reserved line) for error detection and correction.

In one embodiment, during normal operation, the reserved cache line is not used, and eight ECC bytes in a cache line provide single device data correction (SDDC). Thus, no performance and power costs are incurred. After a device fails, part of the ECC (e.g., the error locator check bits) are copied into the four extra bytes per cache line available in the reserved cache line. Data from the failed device is copied to the device previously used to store ECC data.

A read or write operation after a device failure will generate an additional CAS to read the reserved line. In one embodiment, 100% detection and correction of a second device failure can be achieved with the four bytes of extra ECC available per line. Reading the reserved line could be optional, depending on the detection of the error by the reduce ECC available within the data line. Reduced ECC may be enough to provide 100% error detection.

Figure 1:
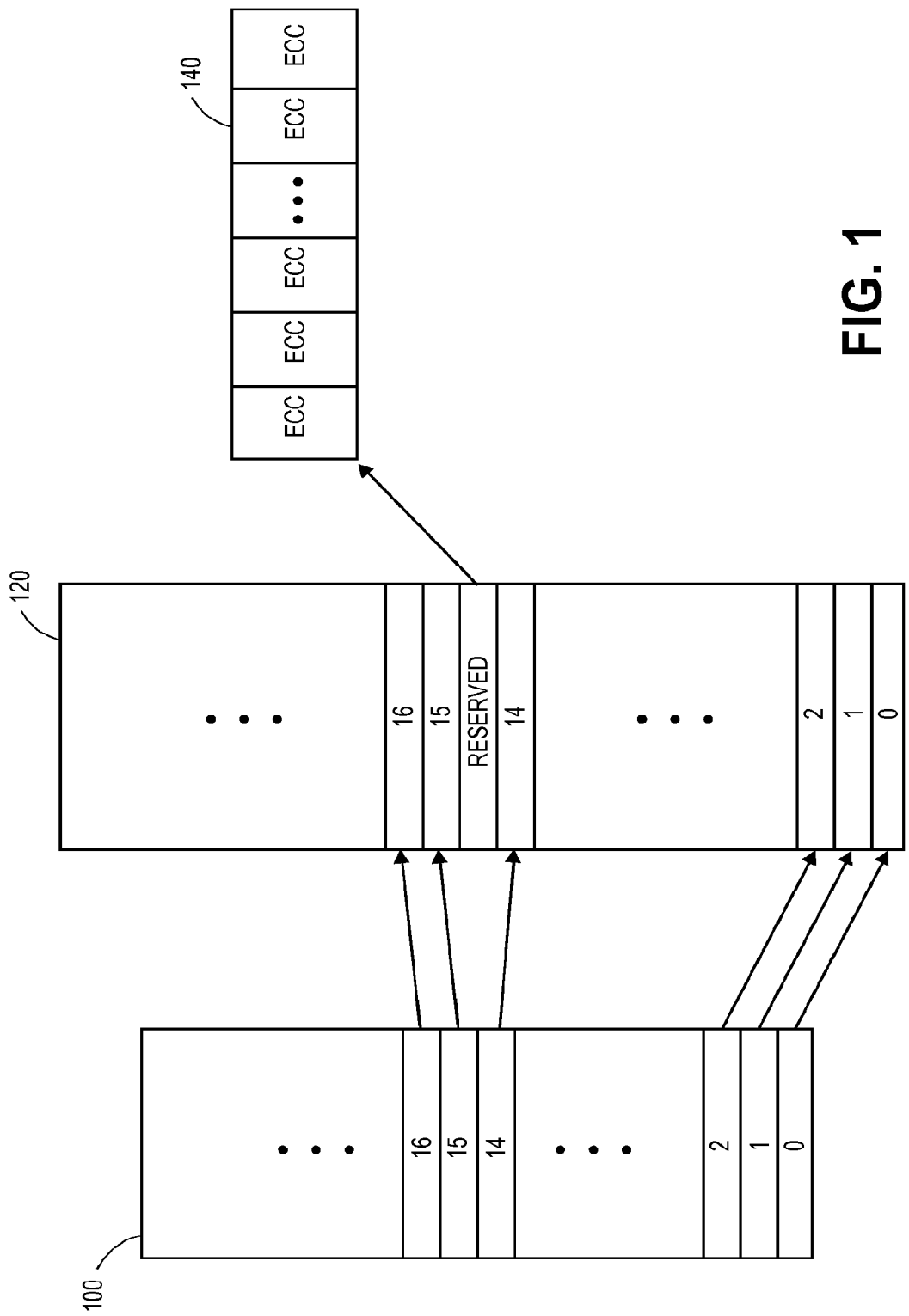
FIG. 1 is a conceptual illustration of a memory storing cache lines and having reserved space.

FIG. 1 is a conceptual illustration of a memory storing cache lines and having reserved space. The example of FIG. 1 illustrates only one reserved line; however, any number of reserved cache lines can be supported. In one embodiment, one out of each 16 cache lines is reserved for a ×4 memory configuration. In an alternate embodiment, one out of each eight cache lines is reserved for a ×8 memory configuration.

Virtual memory 100 represents the memory locations from the perspective of the host system. Virtual memory 100 provides a range of memory locations within the range of memory as supported by the memory system.

Locations within virtual memory 100 are mapped to physical memory 120. Physical memory 120 includes locations for each of the locations represented by virtual memory as well as one or more reserved lines that may be utilized as described herein. Any type of mapping scheme between virtual memory 100 and physical memory 120 may be utilized.

Reserved line 140 represents a line of data that exists within physical memory 120, but is not used in the normal manner while all memory devices are functioning properly. Reserved line 140 may be used to store ECC data for other lines within physical memory 120 as described herein.

Figure 2:
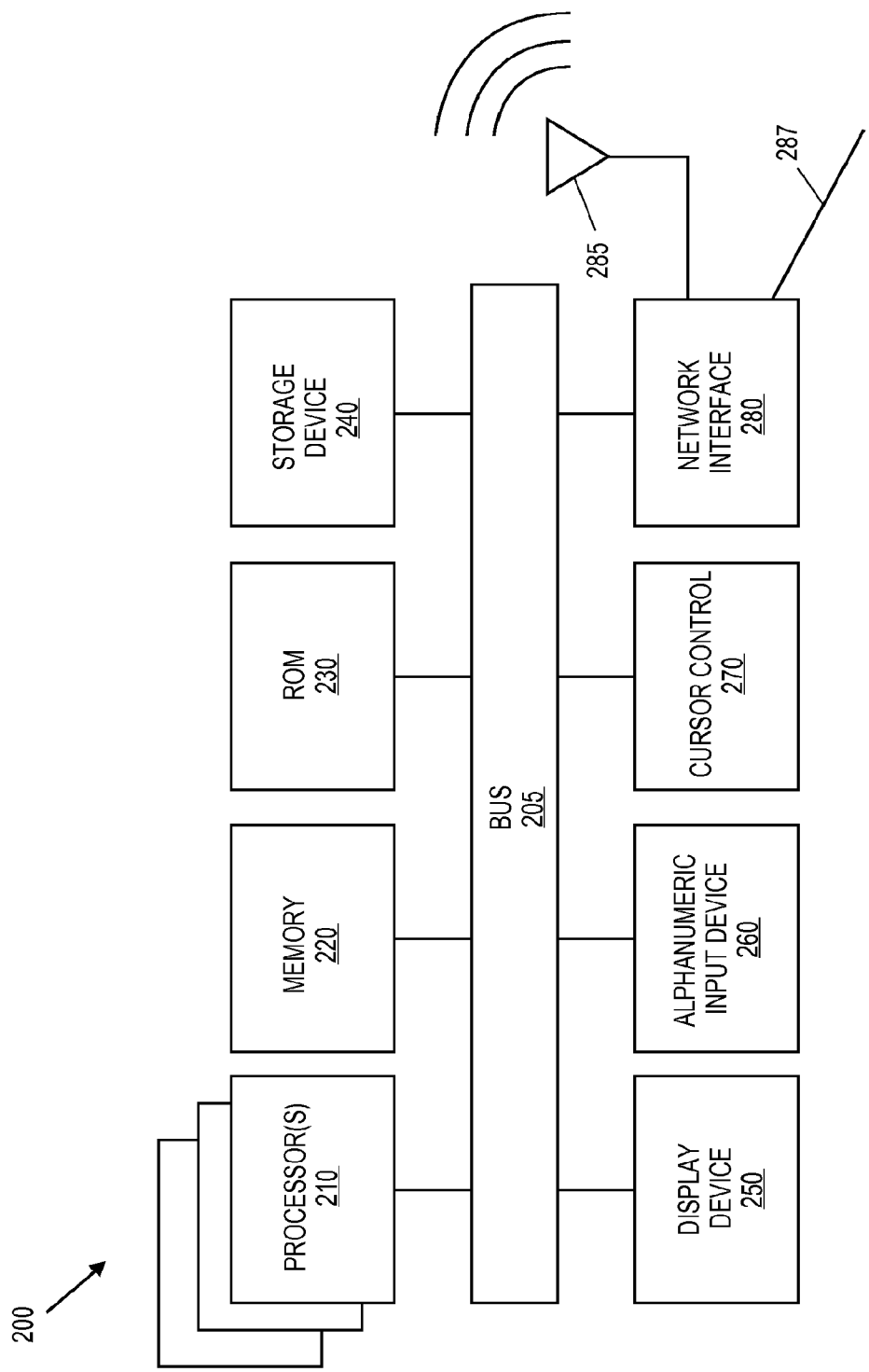
FIG. 2 is a block diagram of one embodiment of an electronic system.

FIG. 2 is a block diagram of one embodiment of an electronic system. The electronic system illustrated in FIG. 2 is intended to represent a range of electronic systems (either wired or wireless) including, for example, desktop computer systems, laptop computer systems, cellular telephones, personal digital assistants (PDAs) including cellular-enabled PDAs, set top boxes, smartphones, tablets, etc. Alternative electronic systems may include more, fewer and/or different components.

Electronic system 200 includes bus 205 or other communication device to communicate information, and processor 210 coupled to bus 205 that may process information. While electronic system 200 is illustrated with a single processor, electronic system 200 may include multiple processors and/or co-processors. Electronic system 200 further may include random access memory (RAM) or other dynamic storage device 220 (referred to as main memory), coupled to bus 205 and may store information and instructions that may be executed by processor 210. Main memory 220 may also be used to store temporary variables or other intermediate information during execution of instructions by processor 210.

Electronic system 200 may also include read only memory (ROM) and/or other static storage device 230 coupled to bus 205 that may store static information and instructions for processor 210. Data storage device 240 may be coupled to bus 205 to store information and instructions. Data storage device 240 such as a magnetic disk or optical disc and corresponding drive may be coupled to electronic system 200.

Electronic system 200 may also be coupled via bus 205 to display device 250, such as a cathode ray tube (CRT) or liquid crystal display (LCD), to display information to a user. Alphanumeric input device 260, including alphanumeric and other keys, may be coupled to bus 205 to communicate information and command selections to processor 210. Another type of user input device is cursor control 270, such as a mouse, a trackball, or cursor direction keys to communicate direction information and command selections to processor 210 and to control cursor movement on display 250.

Electronic system 200 further may include network interface(s) 280 to provide access to a network, such as a local area network. Network interface(s) 280 may include, for example, a wireless network interface having antenna 285, which may represent one or more antenna(e). Network interface(s) 280 may also include, for example, a wired network interface to communicate with remote devices via network cable 287, which may be, for example, an Ethernet cable, a coaxial cable, a fiber optic cable, a serial cable, or a parallel cable.

In one embodiment, network interface(s) 280 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 280 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Figure 3:
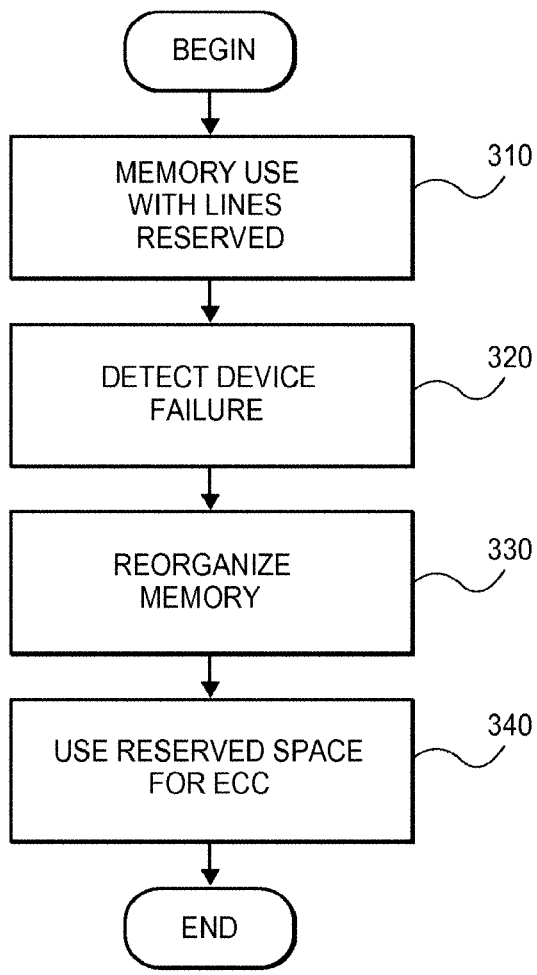
FIG. 3 is a flow diagram of one embodiment of a technique for using a reserved cache line.

FIG. 3 is a flow diagram of one embodiment of a technique for using a reserved cache line. The technique of FIG. 3 can be used, for example, with memory as organized as illustrated in FIG. 1. In one embodiment, the mapping, reorganizing, and other memory operations are managed by a memory controller within, for example, memory 220 or processor 210 of FIG. 2.

Under normal conditions when all memory devices are operating properly, the reserved lines are not used, 310. In one embodiment, the reserved cache line is not visible to the memory system addressing mechanism. In one embodiment, four reserved cache lines are provided for each page of memory; however, other configurations can also be supported. In one embodiment, during normal operation, the reserved cache line is not used, and eight ECC bytes in a cache line provide single device data correction (SDDC). Thus, no performance and power costs are incurred.

While this reduces the amount of memory available for use during normal operation, the techniques describe herein provide a less complex and less expensive solution as compared to traditional lockstepping and/or multi-channel solutions as are currently used.

A device failure is detected, 320. Device failure can be detected using any mechanism known in the art. Further, the presence of a failed device may be communicated in any manner known in the art.

In response to a failed/failing device, memory is reorganized, 330. After a device fails, part of the ECC (e.g., the error locator check bits) are copied into the four extra bytes per cache line available in the reserved cache line. Data from the failed device is copied to the device previously used to store ECC data.

Once the memory is reorganized, the reserved space is used for ECC, 340. In one embodiment, devices previously used for ECC storage may be used for data line storage with the ECC data being moved to the previously reserved space.

A read or write operation after a device failure will generate an additional CAS to read the reserved line. In one embodiment, 100% detection and correction of a second device failure can be achieved with the four bytes of extra ECC available per line. Reading the reserved line could be optional, depending on the detection of the error by the reduce ECC available within the data line. Reduced ECC may be enough to provide 100% error detection.

Methods, techniques, systems and apparatuses for utilizing reserved space for error correcting functionality. A cache line ("reserved line") in a plurality of cache lines to store error correcting code (ECC) data is utilized for storing ECC data corresponding to other cache lines within the plurality of cache lines when a memory device has failed. In one embodiment, a memory device corresponding to the plurality of cache lines is determined to be defective prior to storing the ECC data in the reserved line.

The plurality of cache lines may be a page of cache lines. The plurality of cache lines can be 16 cache lines. In one embodiment, nine memory devices store the plurality of cache lines with eight of the memory devices storing cache line data and one of the memory devices storing ECC data when the nine memory devices are functional. In one embodiment, in response to one of the nine memory devices failing, the eight functional memory devices storing cache line data and the reserved line storing ECC data. In one embodiment, the ECC data stored in the reserved line comprises error locator check bits.

A memory controller can include an interface to send data to and receive data from one or more memory devices, and control logic coupled with the interface. The control logic causes a selected cache line ("reserved line") in a plurality of cache lines to store error correcting code (ECC) data, and causes to be stored within the reserved line ECC data corresponding to other cache lines within the plurality of cache lines.

The plurality of cache lines may be a page of cache lines. The plurality of cache lines can be 16 cache lines. In one embodiment, nine memory devices store the plurality of cache lines with eight of the memory devices storing cache line data and one of the memory devices storing ECC data when the nine memory devices are functional. In one embodiment, in response to one of the nine memory devices failing, the eight functional memory devices storing cache line data and the reserved line storing ECC data. In one embodiment, the ECC data stored in the reserved line comprises error locator check bits.

A system can include memory devices and control logic coupled with the memory devices. The control logic causes a selected cache line ("reserved line") in a plurality of cache lines to store error correcting code (ECC) data, and causes to be stored within the reserved line ECC data corresponding to other cache lines within the plurality of cache lines.

The plurality of cache lines may be a page of cache lines. The plurality of cache lines can be 16 cache lines. In one embodiment, nine memory devices store the plurality of cache lines with eight of the memory devices storing cache line data and one of the memory devices storing ECC data when the nine memory devices are functional. In one embodiment, in response to one of the nine memory devices failing, the eight functional memory devices storing cache line data and the reserved line storing ECC data. In one embodiment, the ECC data stored in the reserved line comprises error locator check bits.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   maintaining a reserved cache line in a plurality of cache lines to store error correcting code (ECC) data, wherein the reserved cache line does not have a virtual memory address and the plurality of cache lines other than the reserved cache line have a virtual memory address;
   in response to detection of a data failure associated with one of the plurality of cache lines other than the reserved cache line, moving ECC data of the one cache line from a memory device into the reserved cache line, the reserved cache line in a second memory device, and moving data of the one cache line into the memory device.

2. The method of claim 1 wherein the plurality of cache lines comprises a page of cache lines.

3. The method of claim 1 wherein the plurality of cache lines comprises 16 cache lines.

4. The method of claim 1 wherein nine memory devices store the plurality of cache lines other than the reserved cache line with eight of the nine memory devices to store cache line data and one of the nine memory devices to store ECC data when the nine memory devices are functional.

5. The method of claim 1 wherein, the memory device is used to store the one cache line's data prior to detection of the data failure and the second memory device is used to store the reserved cache line.

6. A memory controller comprising:
   an interface to send data to and receive data from a plurality of memory devices; and
   control logic coupled with the interface, the control logic to maintain a reserved cache line in a plurality of cache lines, where the plurality of cache lines other than the reserved cache line have a corresponding virtual memory address and the reserved cache line does not have a virtual memory address, the control logic to cause, in response to detection of a data failure of one of the plurality of cache lines other than the reserved cache line, ECC data of the one cache line to be moved from a memory device to the reserved cache line, the reserved cache line in a second memory device, and to cause data of the one cache line to be moved into the memory device.

7. The memory controller of claim 6 wherein the plurality of cache lines comprises a page of cache lines.

8. The memory controller of claim 6 wherein the plurality of cache lines comprises 16 cache lines.

9. The memory controller of claim 6 wherein nine memory devices are to store the plurality of cache lines other than the reserved cache line with eight of the nine memory devices to store cache line data and one of the nine memory devices to store ECC data when the nine memory devices are functional.

10. The memory controller of claim 9 wherein, another memory device where the reserved cache line is kept is not one of the nine memory devices.

11. A system comprising:
    a plurality of processing cores;
    a plurality of memory devices;
    control logic coupled with the plurality of memory devices, the control logic to maintain a reserved cache line in a plurality of cache lines, where the plurality of cache lines other than the reserved cache line have a corresponding virtual memory address and the reserved cache line does not have a virtual memory address, the control logic to cause, in response to detection of a data failure of one of the plurality of cache lines other than the reserved cache line, ECC data of the one cache line to be moved from a memory device to the reserved cache line, the reserved cache line in a second memory device, and to cause data of the one cache line to be moved into the memory device; and,
    a network interface.

12. The system of claim 11 wherein the plurality of cache lines comprises a page of cache lines.

13. The system of claim 11 wherein the plurality of cache lines comprises 16 cache lines.

14. The system of claim 11 wherein nine memory devices store the plurality of cache lines other than the reserved cache line with eight of the nine memory devices to store cache line data and one of the nine memory devices to store ECC data when the nine memory devices are functional.

15. The system of claim 14 wherein the reserved cache line is stored in another memory device that is not one of the nine memory devices.

* * * * *